US 7,575,951 B2
(12) United States Patent  (10) Patent No.: US 7,575,951 B2
Choi et al.  (45) Date of Patent: Aug. 18, 2009

(54) FLAT PANEL DISPLAY AND METHOD FOR FABRICATING THE SAME

(75) Inventors: Tae-young Choi, Seoul (KR);
Jun-hyung Kim, Gyeonggi-do (KR);
Keun-kyu Song, Gyeonggi-do (KR);
Mun-pyo Hong, Gyeonggi-do (KR)

(73) Assignee: Samsung Electronics Co., Ltd., Gyeonggi-do (KR)

( * ) Notice: Subject to any disclaimer, the term of this patent is extended or adjusted under 35 U.S.C. 154(b) by 159 days.

(21) Appl. No.: 11/486,685

(22) Filed: Jul. 14, 2006

(65) Prior Publication Data

US 2007/0012916 A1 Jan. 18, 2007

(30) Foreign Application Priority Data

Jul. 14, 2005 (KR) .................... 10-2005-0063926

(51) Int. Cl.
 *H01L 51/40* (2006.01)
(52) U.S. Cl. ............... 438/99; 438/30; 438/34; 438/149; 257/40; 257/59; 257/72; 257/E51.005
(58) Field of Classification Search ............. 438/30, 438/34, 99, 149, 151; 257/40, 59, 66, 72, 257/347, E51.001, E51.005, E51.006, E21.007; 427/58, 123, 124, 125
See application file for complete search history.

(56) References Cited

U.S. PATENT DOCUMENTS

| 6,528,816 | B1 * | 3/2003 | Jackson et al. ............ 257/40 |
| 6,661,026 | B2 * | 12/2003 | Lee et al. .................. 257/59 |
| 6,734,049 | B2 * | 5/2004 | Yoo et al. ................ 438/151 |
| 7,170,571 | B2 * | 1/2007 | Chae ......................... 349/47 |
| 7,220,612 | B2 * | 5/2007 | Ahn et al. ................... 438/30 |
| 2004/0241987 | A1 * | 12/2004 | Kim et al. .................. 438/672 |

2005/0057152 A1 3/2005 Park (Continued)

FOREIGN PATENT DOCUMENTS

CN 1710721 A 12/2005

(Continued)

OTHER PUBLICATIONS

Patent Abstracts of Japan, Publication No. 2000-269504, Sep. 29, 2000, 1 p.

(Continued)

*Primary Examiner*—Han Tran T Nguyen
*Assistant Examiner*—Daniel Whalen
(74) *Attorney, Agent, or Firm*—Haynes and Boone, LLP

(57) ABSTRACT

A method for fabricating a flat panel display, comprising preparing an insulating substrate; forming separated source and drain electrodes on the insulating substrate to define a channel region; forming a first passivation layer on the source and drain electrodes; forming a metal layer having an opening corresponding to the channel region on the first passivation layer; forming a deposition opening in the passivation layer by using the metal layer as a mask to expose the channel region; forming an organic semiconductor layer and a second passivation layer, in turn, in the deposition opening and on the metal layer; and removing the metal layer, the organic semiconductor layer and the second passivation layer while allowing the layers formed in the deposition opening to remain.

12 Claims, 14 Drawing Sheets

U.S. PATENT DOCUMENTS

| | | |
|---|---|---|
| 2005/0078242 A1 | 4/2005 | Park |
| 2005/0158900 A1* | 7/2005 | Lee et al. .................... 438/30 |
| 2007/0001577 A1* | 1/2007 | Yoo et al. .................. 313/402 |
| 2007/0134857 A1* | 6/2007 | Suh et al. ................... 438/149 |
| 2007/0158744 A1* | 7/2007 | Song et al. ................. 257/347 |
| 2008/0078993 A1* | 4/2008 | Cho et al. ................... 257/40 |

FOREIGN PATENT DOCUMENTS

| | | |
|---|---|---|
| JP | 2000-269504 | 9/2000 |
| JP | 2004-266267 | 9/2004 |
| KR | 1020040070716 A | 4/2003 |
| KR | 10-0393324 | 7/2003 |
| TW | 093114778 | 5/2004 |
| TW | 200515621 | 5/2005 |

OTHER PUBLICATIONS

Patent Abstracts of Japan, Publication No. 2004-266267, Sep. 24, 2004, 1 p.

* cited by examiner

FLAT PANEL DISPLAY AND METHOD FOR FABRICATING THE SAME

CROSS-REFERENCE TO RELATED APPLICATIONS

This application claims the benefit of Korean Patent Application No. 2005-0063926, filed on Jul. 14, 2005, in the Korean Intellectual Property Office, the disclosure of which is incorporated herein by reference.

FIELD OF THE INVENTION

The present invention relates to a method for fabricating a flat panel display and, more particularly, to a method for fabricating a flat panel display which can reduce damage of a characteristic of an organic thin film transistor ("TFT").

DESCRIPTION OF THE RELATED ART

A flat panel display ("FPD") includes a TFT substrate having a TFT as a switching and driving device for controlling and driving an operation of each pixel. The TFT includes a gate electrode, source and drain electrodes which are separated by the gate electrode so as to define a channel region, and a semiconductor layer. The semiconductor layer is usually formed of amorphous silicon or polysilicon. However, organic semiconductors are now available and offer the advantage of being formable at room temperature and atmospheric pressure and can be applied to a plastic substrate which is not heat resistant. However, organic semiconductors offer poor resistance to chemicals and plasma. In order to solve the problem, it has been proposed to form the organic semiconductor layer after the gate, source and the drain electrodes are formed by interposing a thick organic film between the electrodes and the organic semiconductor layer. The organic semiconductor layer can then be patterned by using a passivation layer, thereby leaving the organic semiconductor layer only on the channel region.

In the patterning process, the passivation layer is coated over the entire surface of the organic semiconductor layer leaving exposed only the layer corresponding to the channel region. However, it is possible that the organic semiconductor layer may be attacked by the chemicals used in patterning the passivation layer and therefore the passivation layer must be formed of a material that does not adversely affect the organic semiconductor layer. Such a desired material may be problematic as a coating.

When patterning the organic semiconductor layer, a part of the organic semiconductor layer which is coated by the passivation layer is safely protected. However, since both sides of the organic semiconductor layer are not coated by the passivation layer and are exposed, they may be attacked by the chemicals used in patterning the passivation layer. Furthermore, if the etching process used in patterning is performed so as to reduce the attack on the exposed sides, the patterning may allow some of the organic semiconductor to remained on a pixel electrode, causing a product defect.

SUMMARY OF THE INVENTION

The present invention provides a method for fabricating a flat panel display employing an organic TFT that is resistant to processing damage. In accordance with the method of the present invention, a source and drain electrode are formed on an insulating substrate so as to define a channel region there between; a first passivation layer is formed on the source and drain electrodes; a metal layer having an opening corresponding to the channel region is formed on the first passivation layer as a mask; the channel region is exposed through the opening in the first passivation layer; an organic semiconductor layer and a second passivation layer, in turn, are deposited through the deposition opening; and the metal layer, the organic semiconductor layer and the second passivation layer are removed except for what is left remaining in the deposition opening.

According to an embodiment of the present invention, the step of removing the metal layer, the organic semiconductor layer and the second passivation layer is performed by a lift-off process that uses an etchant that does not substantially affect the second passivation layer. Advantageously, the metal layer and an upper layer on the metal layer are removed at the same time.

The present invention also achieves a flat panel display comprising: an insulating substrate; a source electrode and a drain electrode formed on the insulating substrate so as to define a channel region therebetween; a first passivation layer formed on the source and drain electrodes so as to have a deposition opening for exposing at least a part of each of the source and drain electrodes; an organic semiconductor layer formed on the deposition opening; and a second passivation layer formed on the organic semiconductor layer and having a different thickness than the first passivation layer. According to an aspect of this embodiment of the invention, the second passivation layer has a lower height than the first passivation layer.

BRIEF DESCRIPTION OF THE DRAWINGS

The above and/or other aspects and advantages of the present invention will become apparent and more readily appreciated from the following description of the exemplary embodiments, taken in conjunction with the accompanying drawings of which:

FIGS. 3a, 3b, 3c, 3d, 3e, 3f, 3g, 3h, 3i, 3j and 3k are cross-sectional views sequentially showing a method for fabricating the TFT substrate according to the first embodiment of the present invention.

DETAILED DESCRIPTION OF THE PREFERRED EMBODIMENT

Figure 1:
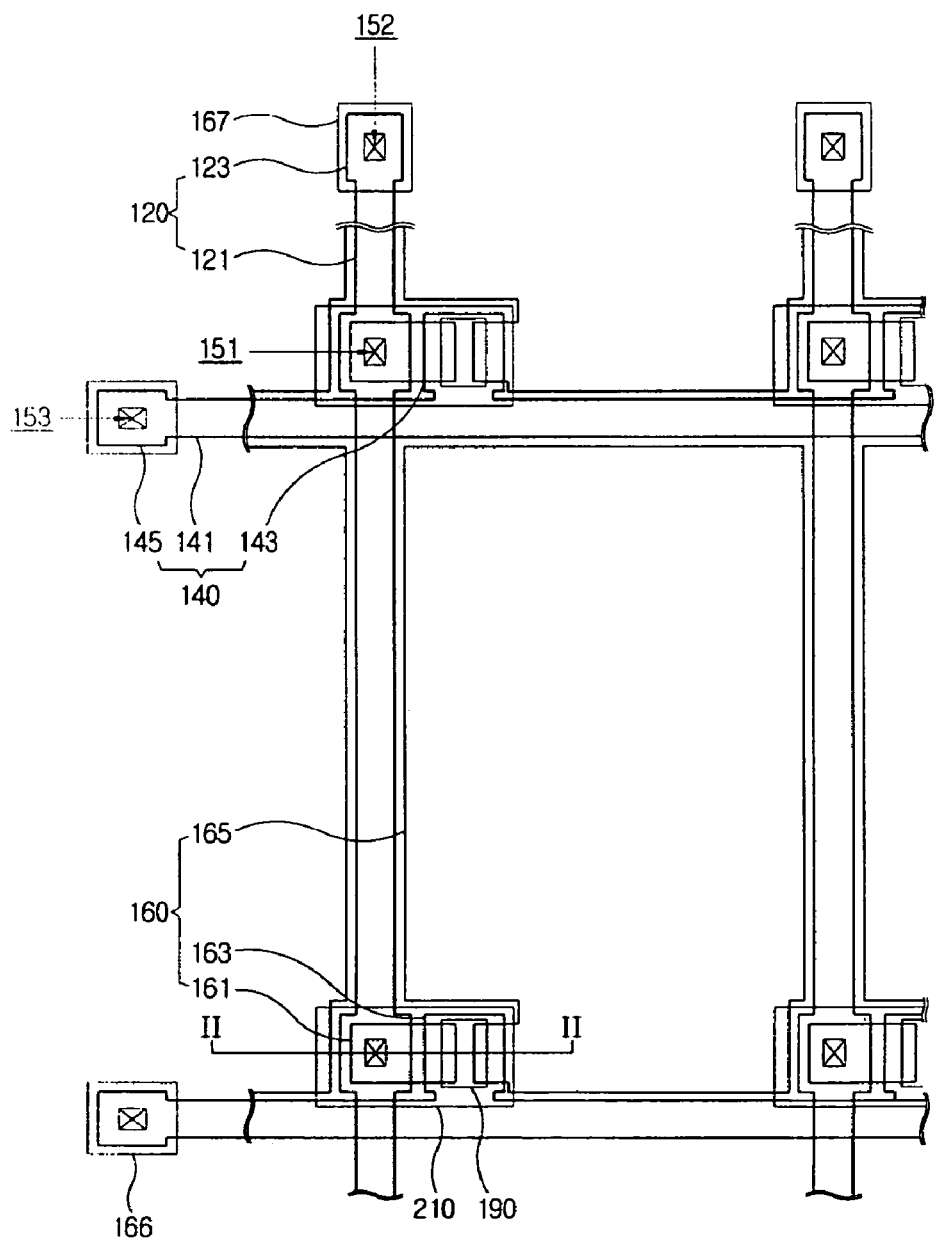
FIG. 1 is a plot plan view of a TFT substrate according to the first embodiment of the present invention.

Reference will now be made in detail to exemplary embodiments of the present invention, examples of which are illustrated in the accompanying drawings, wherein like reference numerals refer to like elements throughout. The embodiments are described below in order to explain the present invention by referring to the figures. In the drawings, the thickness and size of layers, films, and regions are exaggerated for clarity. It will be understood that when an element such as a layer, film, region, or substrate is referred to as being (formed) "on" another element, it can be directly laid on the other element or intervening elements may also be present.

Figure 2:
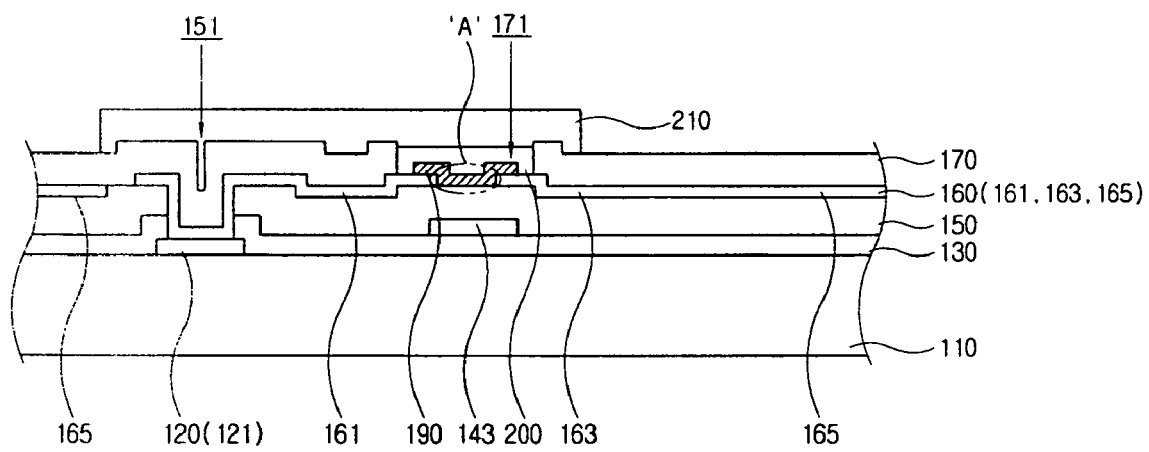
FIG. 2 is a cross-sectional view taken along line II-II of FIG. 1.

FIG. 1 is a plan view of a thin film transistor ("TFT") substrate according to the first embodiment of the present invention and FIG. 2 is a cross-sectional view taken along line II-II of FIG. 1. A flat panel display ("FPD") of the present invention includes a TFT substrate 100 having a TFT as a switching and driving device for controlling and driving an operation of each pixel. The TFT substrate 100 includes an insulating substrate 110, a data line 120 formed on the insulating substrate 110, an interlayer insulating film 130 formed on the data line 120, a gate line 140 formed on the interlayer insulating film 130, a gate insulating film 150 formed on the gate line 140, a transparent electrode layer 160 formed on the gate insulating film 150, and an organic semiconductor layer 190 formed on the gate insulating film 150 while being contacted with at least a part of the transparent electrode layer 160.

The insulating substrate 110 can be made of glass or plastic which offers the advantage that the flat panel display will be flexible. However, a plastic insulation substrate 110 is not heat resistant. A semiconductor layer that can be formed at room temperature and atmospheric pressure can be used with a plastic insulating substrate 110 made of plastic materials such as polycarbon, polyimide, PES, PAR, PEN, PET, etc.

Data line 120 formed on substrate 110 includes a data line 121 that extends in one direction and a data pad 123 formed at an end of the data line 121 to receive an externally supplied driving or controlling signal. Data line 120 may be made of any good conductivity relatively low-priced metal such as Al, Cr and Mo, or a relatively higher price material such as Au, Pt, Pd, ITO (Indium Tin Oxide) and IZO (Indium Zinc Oxide) and may be composed of a single or a plurality of layers containing at least one of the above-mentioned materials.

According to the present invention, in order to protect the gate insulating film 150 from a chemical material used in a data line forming process, first of all, the data line 120 is formed, and then the interlayer insulating film 130 is formed on the data line 120. The interlayer insulating film 130 covers the data line 120 on the insulating substrate 110. The interlayer insulating film 130 is formed of an inorganic material such as $SiN_x$ or $SiO_x$, etc., so as to electrically insulate between the data line 120 and the gate line 140. Although not shown in the drawing, the interlayer insulating film 130 may further include a thick film of an organic material on the inorganic layer. This additional thick organic film is to perfectly protect the organic semiconductor layer 190 which has poor resistance to the chemicals or plasma used in forming the data lines. Such chemicals may flow into the organic semiconductor layer 190 through a gap of a contact opening 151, 152 (which openings will be described below), or through an interface between the layers, thereby attacking the organic semiconductor layer 190. The interlayer insulating film 130 is formed with first and second contact openings 151 and 152 to respectively expose the data line 121 and the data pad 123.

The gate line 140 is formed on the interlayer insulating film 130. The gate line 140 includes a gate line 141 formed to intersect with the data line 121 and define a pixel region, a gate pad 145 formed at an end of the gate line 141 to receive a driving or controlling signal from the outside, and a gate electrode 143 formed as a branch of the gate line 141 at a place corresponding to the organic semiconductor layer 190. Gate line 140 may also be made of Al, Cr, Mo, Au, Pt, Pd, etc., and have a single layer or a plurality of layers.

The gate insulating film 150 is formed on the gate line 140. The gate insulating film 150 functions to insulate data line 120 from gate line 140, and simultaneously protects organic semiconductor layer 190. The gate insulating film 150 may contain at least one of inorganic and organic materials such as $SiN_x$, $SiO_x$, BCB, Si polymer, PVV, etc. Gate insulating film 150 has a third contact opening 153 to expose gate pad 145 as well as openings corresponding to the first and second contact openings 151 and 152.

Transparent electrode layer 160 is formed on the gate insulating film 150 and is connected through the first contact opening 151 with data line 121. Layer 160 includes a source electrode 161 partially contacted with the organic semiconductor layer 190, a drain electrode 163 separated from the source electrode 161 by interposing the organic semiconductor layer 190 therebetween, and a pixel electrode 165 positioned in the pixel region so as to be connected with the drain electrode 163. Transparent electrode layer 160 further includes a data pad contacting member 167 connected with the data pad 123, and a gate pad contacting member 166 connected through the third contact opening 153 with the gate pad 145. The transparent electrode layer 160 is formed of a transparent conductive material such as ITO, IZO, etc. The source electrode 161 is physically and electrically connected through the first contact opening 151 with the data line 121 so as to receive an image signal. The drain electrode 163 is separated from the source electrode 161 so as to define a channel region A, which forms the TFT along with the gate electrode 143. The TFT functions as a switching and driving device for controlling and driving an operation of each pixel electrode 165.

A first passivation layer 170 is formed on the gate insulating film 150 with a deposition opening 171 to expose the channel region A and in which the organic semiconductor layer 190 is deposited later. The first passivation layer 170 may be an organic film formed of PVA (Polyvinyl Alcohol), BCB (Benzocyclobutene), etc., or an acrylic-based photosensitive organic film. Further, it is preferable that the passivation layer 170 should be formed to be thick in order to form the deposition opening, in which the organic semiconductor layer 190 is deposited, by a wet etching process using a metal layer 180. Organic semiconductor layer 190 is positioned in the deposition opening 171 formed in the passivation layer 170. The organic semiconductor layer 190 covers the channel region A and at least partially contacts with the partially exposed source and drain electrode 161 and 163. Oganic semiconductor layer 190 may be formed of pentacene having five benzene rings linked to each other, perylenetetracarboxlic dianhidride (PTCDA), oligothiopene, polythiophene, polythienylenevinylene, etc., and also formed of one of the existing organic semiconductor materials.

A second passivation layer 200 is formed on the organic semiconductor layer 190 in the deposition opening 171. The second passivation layer 200 is to prevent a characteristic of the organic semiconductor layer 190 from being deteriorated upon a lift-off process to be described below. It may be formed of the same material as the first passivation layer 170 or other materials. The second passivation layer 200 has a different height from the first passivation layer 170, preferably a lower height than the first passivation layer 170. And it is preferable that the second passivation layer 170 is formed of a material which is not affected by etchant used in the lift-off process to be described below.

A further passivation layer 210 may be selectively formed on the second passivation layer 200 to cover an area from the first contact opening 151 to the channel region A. The passivation layer 210 is to prevent a characteristic of the organic semiconductor layer 190 from being deteriorated. It also is formed of an organic material, and it may be the acrylic-based photosensitive organic film.

Figure 3A:
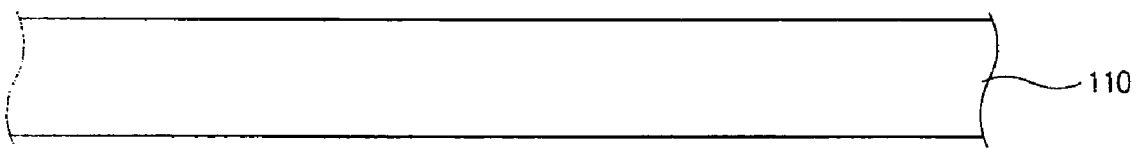
Figure 3B:
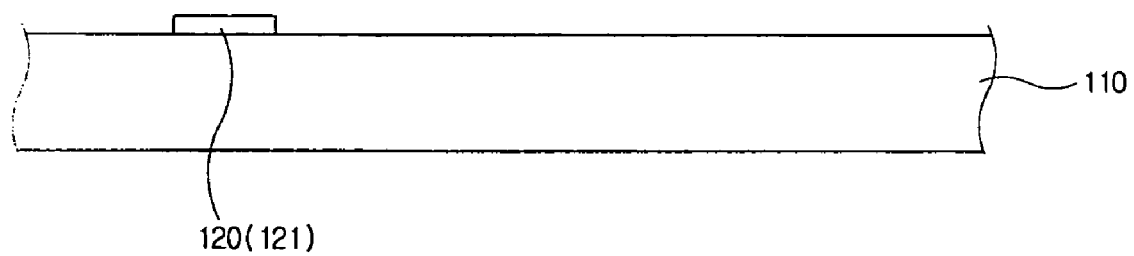
Figure 3C:
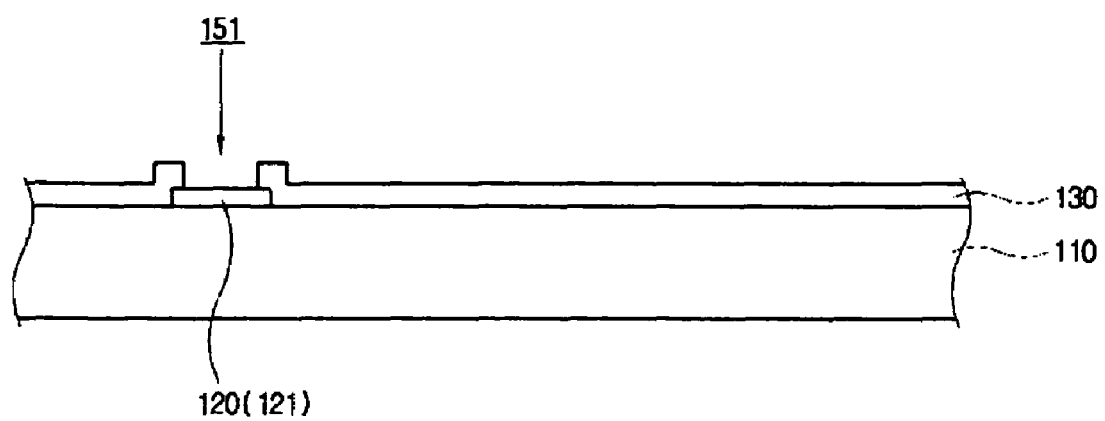

Hereafter, a method for manufacturing a flat panel display having an organic TFT will be described with reference to FIGS. 3a to 3k. As shown in FIG. 3a, the insulating substrate 110 containing an insulation material such as glass, quartz, ceramic, plastic, etc., is prepared. Preferably, a plastic substrate is used in fabricating a flexible FPD. Then, as shown in FIG. 3b, after a data line material is deposited on the insulating substrate 110 by using a sputtering method, etc., the data line 121 is formed by a photolithography process. As shown in FIG. 3c, an interlayer insulating material comprising at least one of the inorganic material such as $SiN_x$, $SiO_x$, etc., or the organic material such as PVA, BCB, etc., is coated on substrate 110 and data line 120 to form the interlayer insulating film 130. If the interlayer insulating material is an organic material, the interlayer insulating film 130 can be formed by a spin coating or slit coating method, etc. If the interlayer insulating material is an inorganic material, it can be formed by a chemical vapor deposition (CVD), plasma enhanced chemical vapor deposition (EP-CVD), etc.

Figure 3D:
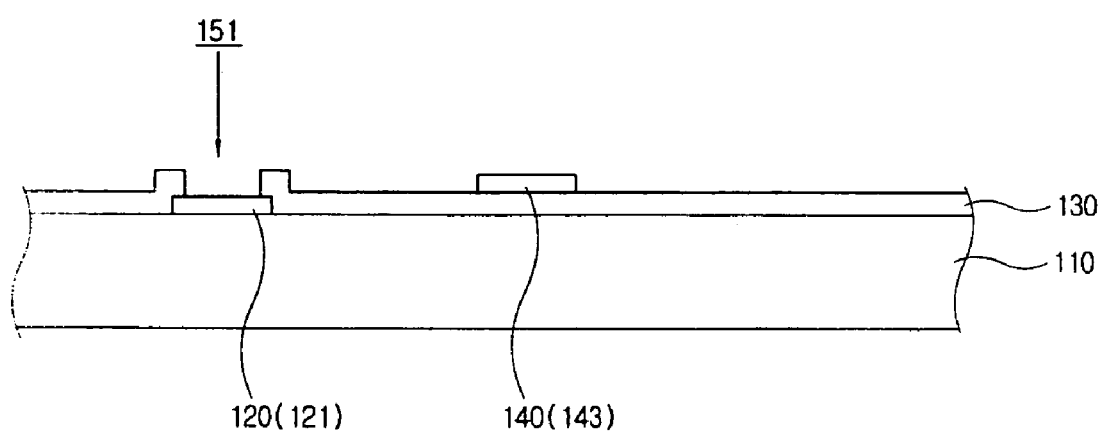
Figure 3E:
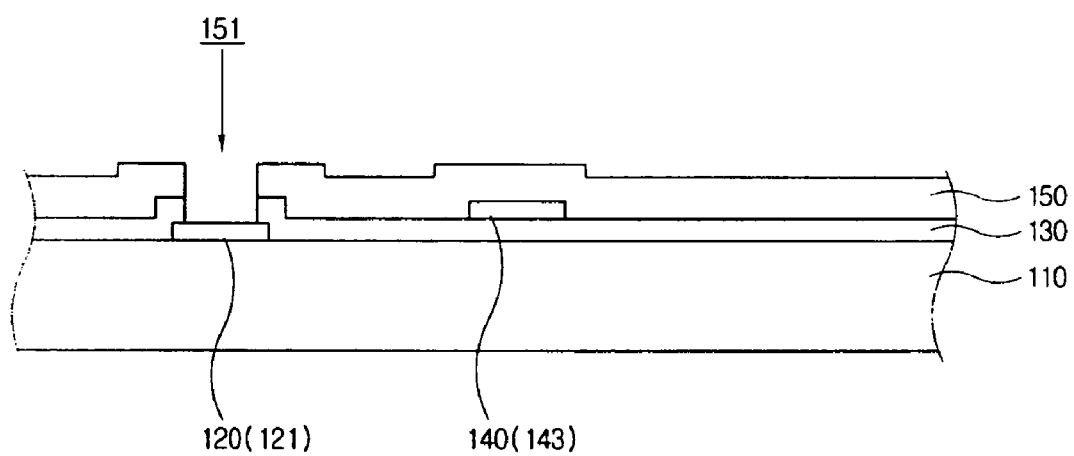

As described above, an organic film as well as an inorganic film can be applied as the interlayer insulating film 130. A first contact opening 151 for exposing the data line 121 is formed by an etching process using the photosensitive organic film as a shielding mask. As shown in FIG. 1, a second contact opening 152 for exposing the data pad 123 is formed by the same process as in the first contact opening 151. Then, as shown in FIG. 3d, after a gate line material containing at least one of Al, Cr, Mo, Au, Pt, Pd, etc., is deposited on the interlayer insulating film 130 by a sputtering method etc., the gate line 141, gate electrode 143 and the gate pad 145 are formed by a photolithography process.

Sequentially, the thick gate insulating film 150 formed of an organic material such as PVA, BCB, etc., is formed on the gate line 140 and the interlayer insulating film 130 by spin coating or slit coating method, etc. As shown in FIGS. 1 and 2, in the gate insulating film 150, the third contact opening 153 and the opening corresponding to the first contact opening 151 are simultaneously formed by the etching process using the photosensitive organic film as the shielding mask. Gate insulating film 150 may be formed of an inorganic material such as $SiN_x$ or $SiO_x$ by the CVD or PE-PVD method.

Figure 3F:
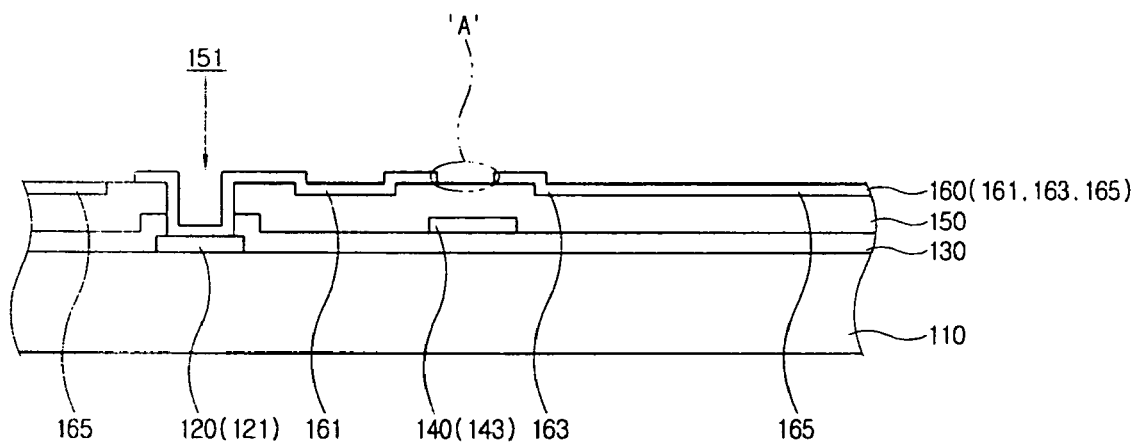

As shown in FIG. 3f, a transparent conductive metallic oxide material (transparent conductive material) such as ITO or IZO is coated on the gate insulating film 150 by the sputtering method, and then the transparent electrode layer 160 is formed by using the photolithography process or the etching process. The transparent electrode layer 160 is connected through the first contact opening 151 with the data line 121, and includes the source electrode 161 which is at least partially contacted with the organic semiconductor layer 170, the drain electrode 163 separated from the source electrode 161 by interposing the organic semiconductor layer 190 therebetween so as to define the channel region A, and a pixel electrode 165 positioned in the pixel region so as to be connected with the drain electrode 163. As shown in FIG. 1, The transparent electrode layer 160 further includes data pad contacting member 167 connected with the data pad 123, and the gate pad contacting member 166 connected through the third contact opening 153 with the gate pad 145.

Figure 3G:
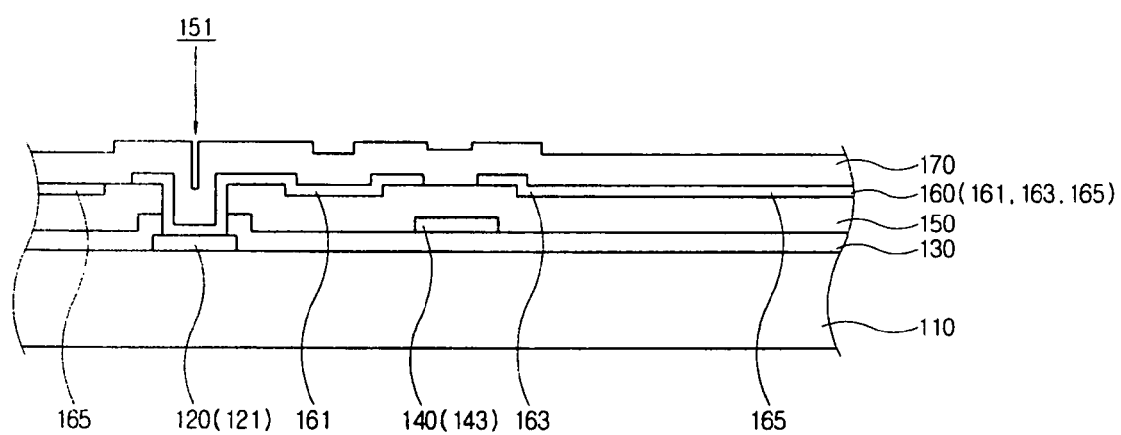
Figure 3H:
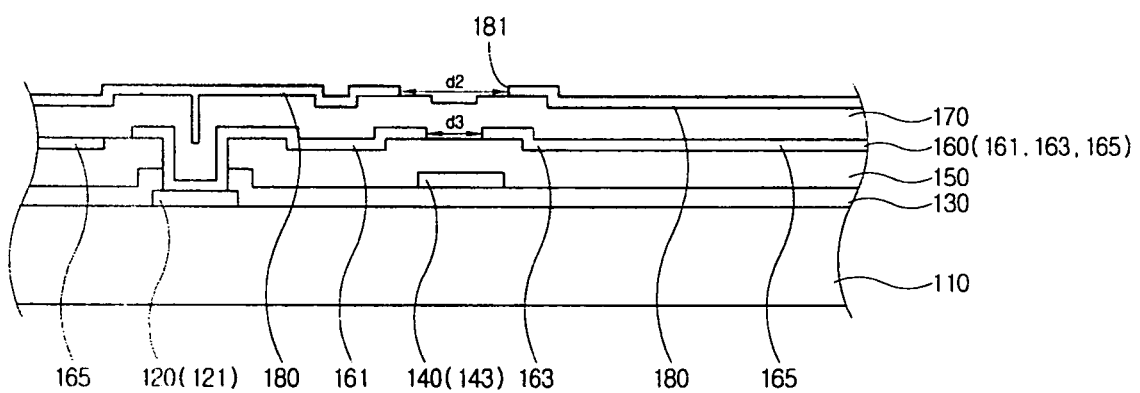
Figure 31:
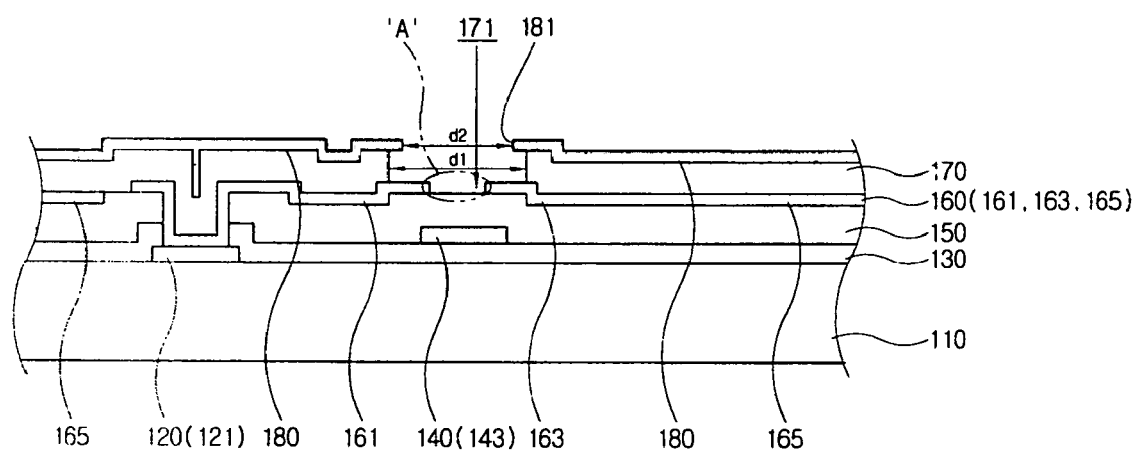

Then, as shown in FIG. 3g, a first passivation layer material formed of PVA, BDB, acrylic-based photosensitive organic material, etc., is coated on the transparent electrode layer 160 so as to form the first passivation layer 170. And as shown in FIG. 3h, a metal layer material is formed on the first passivation layer 170 by the sputtering method, and then the metal layer 180 having the opening 181 corresponding to the channel region A is formed by the photolithography process or the etching process. It is preferable that a width d2 of opening 181 in metal layer 180 be greater than the width d3 in layer 160 (FIG. 3H) of the channel region A.

As shown in FIG. 3i, the deposition opening 171 for exposing the channel region A is formed in the first passivation film 170 by the wet etching process using the metal layer 180 having the opening 181 as a mask. Since layer 180 is formed of the metal material and the first passivation layer 170 is formed of the organic material, the first passivation layer 170 is etched more by the wet etching process. Thus, at least a part of the metal layer 180 extends over the deposition opening 171 while first passivation layer 170 is undercut. In other words, a width d1 of the deposition opening 171 is greater than that d2 of the opening 181 in the passivation layer.

Figure 3J:
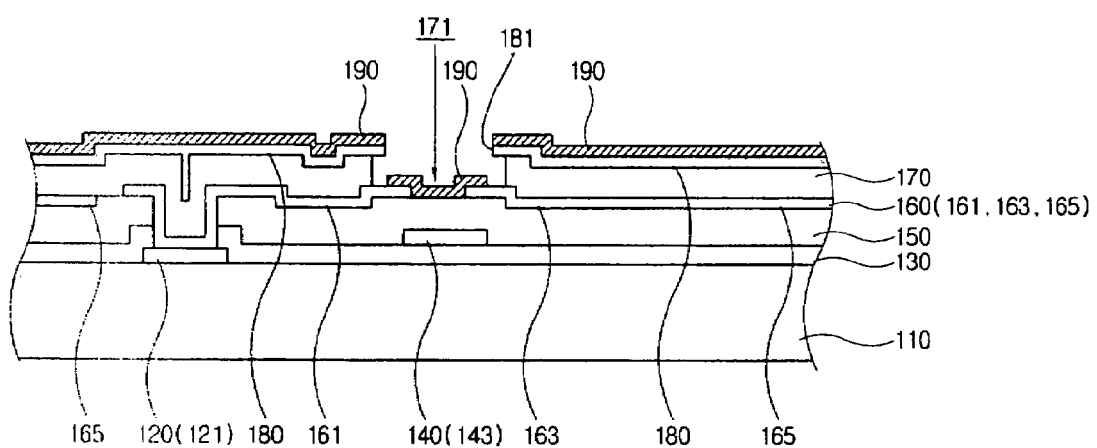
Figure 3K:
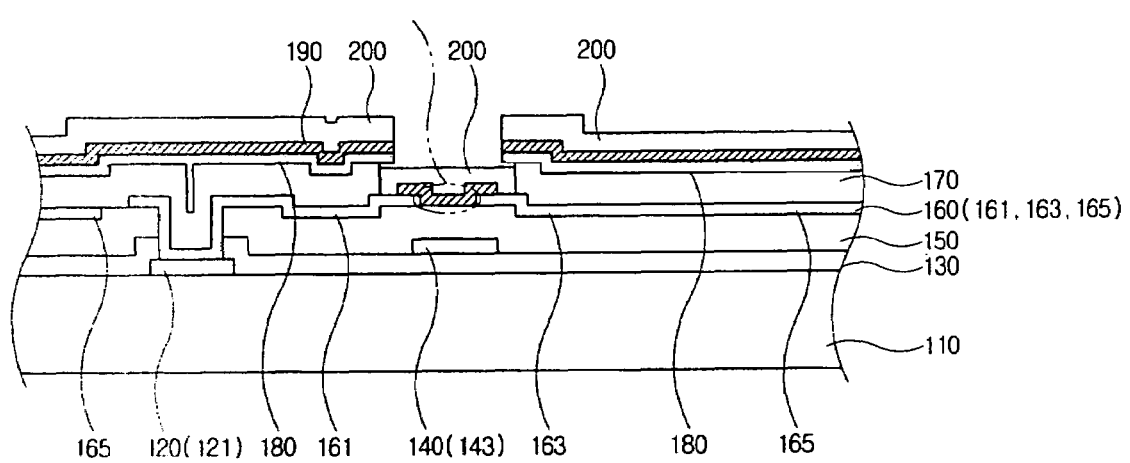

As shown in FIG. 3j, the organic semiconductor material is applied to an upper side of the metal layer 180 and an inside of the deposition opening 171, thereby forming the organic semiconductor layer 190. In turn, as shown in FIG. 3k, the second passivation layer 200 is formed on the organic passivation layer 190 by the spin coating or slit coating method. At this point, since the second passivation layer 200 is formed of the organic material, it covers all of an upper surface and a side face of the organic semiconductor layer 190.

Because an inside of the deposition opening 171 is separated from a peripheral region of the deposition opening 171 by a stepped portion thereof, the organic semiconductor layer 190 is formed at the inside of the deposition opening 171, and then the organic semiconductor layer 190 is patterned in a desired shape.

Then, the metal layer 180 and the upper layers 190 and 200 thereof are removed by a metal lift-off process. However, the organic semiconductor layer 190 and the second passivation layer 200 in the deposition opening 171 that the metal layer 180 does not exist under the layers 190 and 200 are not removed but remained. The metal lift-off process means a method of soaking the substrate in metal etchant that specially reacts on a metal so as to remove the metal layer 180 and thus removing the upper layers 190 and 200. That is, while the metal layer 180 is separated, the upper layers 190 and 200 are lifted off and removed together. preferably, the etchant used in the metal lift-off process does not substantially affect the second passivation layer 200. In other words, it is preferable that the second passivation layer 200 is not etched by the etchant used in the metal lift-off process. If all of the metal layer 180 and the upper layers 190 and 200 are simultaneously removed except them positioned in the deposition opening 171, the patterning process of the organic semiconductor layer 190 is completed. In this process, an upper surface and a side face of the organic semiconductor layer 190 are protected from the attack of the chemical material or plasma by the second passivation layer 200, thereby preventing deterioration of a characteristic of the organic semiconductor layer 190.

As shown in FIG. 2, an organic passivation film 210 is further formed on the first contact opening 151. The organic passivation film 210 can be selectively applied. In case that the passivation film 210 is composed of the photosensitive organic film, the passivation film 210 can be formed by coating, exposing and developing processes. In case that the passivation film 210 is composed of the inorganic film like silicon nitride, it can be formed by deposition and photolithography processes. The organic TFT can be formed as described above. The FPD, such as a liquid crystal display device, an organic electroluminescent display device or an inorganic electroluminescent display, etc., including the organic TFT can be fabricated by a well-known method.

According to the present invention, a pattern of the organic semiconductor layer 190 is not formed by the photolithography and/or etching process, as described above. In the present invention, the deposition opening 171 in which the organic semiconductor layer 190 is deposited is formed in the first passivation layer 170 by using the metal layer 180, and then while the upper surface and all side faces of the organic semiconductor layer 190 are protected by using the second passivation layer 200 which is not affected by the metal etchant, the organic semiconductor layer 190 except that in the deposition opening 171 is removed by the metal lift-off process, thereby patterning the organic semiconductor layer 190. Since the patterning method of the organic semiconductor layer 190 according to the present invention does not use the photolithography or etching process, it is possible to minimize deterioration of the characteristic of the organic semiconductor layer 190, thereby minimizing deterioration of a characteristic of the organic TFT.

Since the second passivation layer 200 covers the upper surface and all the side faces of the organic semiconductor layer 190, the deterioration of the characteristic of the organic semiconductor layer 190 can be effectively minimized, and the etching process can be sufficiently performed. Thus, it is also possible to minimize a defect occurred by the organic semiconductor material remained on the pixel electrode. Furthermore, since the patterning process of the organic semiconductor layer 190 is performed by the simple lift-off process unlike the conventional complicated photolithography process, it is also possible to simplify a fabricating process and fabricate the organic TFT of good quality.

Hereafter, a second embodiment of the present invention will be described with reference to FIG. 4, where the same reference numerals will be used for elements identical to those of the first preferred embodiment and a detailed description of these elements will not be provided. In the first embodiment, the organic semiconductor layer 190 is formed by the evaporation and photolithography processes. However, the second embodiment employs an inkjet method.

Figure 4:
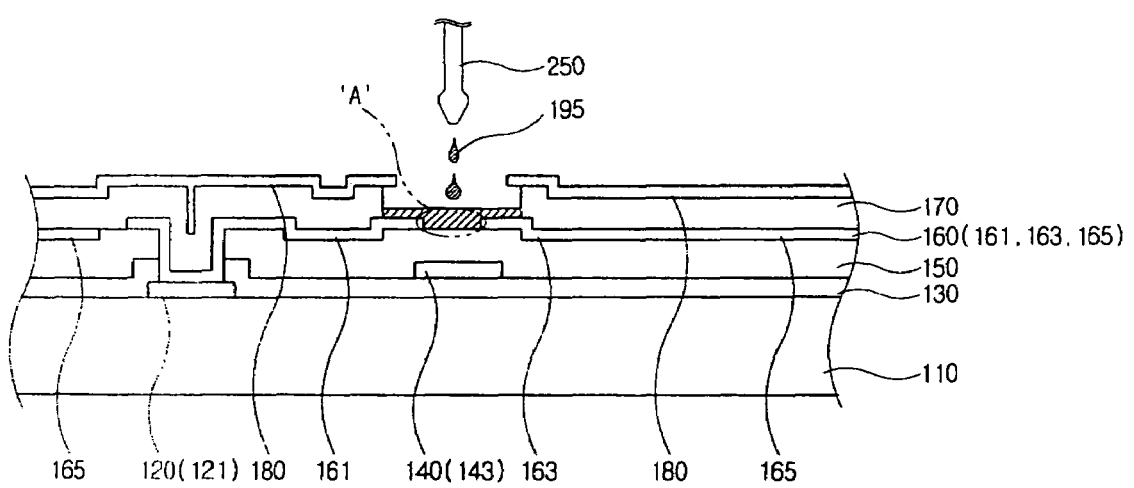
FIG. 4 is a view showing a method for fabricating the TFT substrate according to the second embodiment of the present invention.

As shown in FIG. 4, the organic semiconductor material is jetted at the channel region A by using the deposition opening 171 as a partition wall. The organic semiconductor material may be aqueous or oleaginous depending on a solvent to be used. The organic semiconductor material is treated by a solvent removing process to form the organic semiconductor layer 190. Then, a passivation layer solution 195 is jetted on the organic semiconductor layer 190. The passivation layer solution may be also aqueous or oleaginous depending on a solvent to be used. The passivation layer solution is treated by a solvent removing process to form the passivation layer 200 having a flat surface. Accordingly, the embodiment can provide a simple method for fabricating the organic TFT, which can minimize the deterioration of the characteristic of the organic semiconductor layer 190.

As described above, the present invention provides a simple method for fabricating the FPD, which can minimize the deterioration of the characteristic of the organic TFT.

Further, the present invention provides a FPD in which the deterioration of the characteristic of the organic TFT is minimized. Although a few embodiments of the present invention have been shown and described, it will be appreciated by those skilled in the art that changes may be made in these embodiments without departing from the principles and spirit of the invention, the scope of which is defined in the appended claims and their equivalents. Moreover, the use of the terms; first, second, etc. does not denote any order or importance, but rather the terms; first, second, etc. are used to distinguish one element from another. Furthermore, the use of the terms; an, an, etc. does not denote a limitation of quantity, but rather denote the presence of at least one of the referenced item.

Although a few embodiments of the present invention have been shown and described, it will be appreciated by those skilled in the art that changes may be made in these embodiments without departing from the principles and spirit of the invention, the scope of which is defined in the appended claims and their equivalents.

What is claimed is:

1. A method for fabricating a flat panel display, comprising the steps of:
   preparing an insulating substrate;
   forming a separated source electrode and drain electrode on the insulating substrate to define a channel region;
   forming a first passivation layer on the source and drain electrodes;
   forming a metal layer having an opening corresponding to the channel region on the first passivation layer;
   forming a deposition opening in the first passivation layer by using the metal layer as a mask to expose the channel region;
   forming an organic semiconductor layer and a second passivation layer, in turn, in the deposition opening and on the metal layer; and
   removing the metal layer and a portion of the organic semiconductor layer, thereby allowing the organic semiconductor layer formed in the deposition opening to remain.

2. The method as set forth in claim 1, wherein the step of removing the metal layer is performed by a lift-off process.

3. The method as set forth in claim 2, wherein the lift-off process uses an etchant which does not substantially affect the second passivation layer.

4. The method as set forth in claim 1, wherein the metal layer and an upper layer on the metal layer are removed at the same time.

5. The method as set forth in claim 1, wherein the deposition opening is formed by a wet etching process.

6. The method as set forth in claim 1, wherein the deposition opening has a greater width than the opening.

7. The method as set forth in claim 1, wherein at least a part of the metal layer is further extended in a direction to the deposition opening in comparison with the first passivation layer.

8. The method as set forth in claim 1, further comprising a step of forming a data line on the insulating substrate before forming the source and drain electrodes.

9. The method as set forth in claim 8, further comprising a step of forming an interlayer insulating film having a first contact opening, for exposing at least a part of the data line.

10. The method as set forth in claim 9, further comprising a step of forming a gate electrode corresponding to the interlayer insulating film on the channel region.

11. The method as set forth in claim 10, further comprising a step of forming a gate insulating film between the gate electrode and the source and drain electrodes.

12. The method as set forth in claim 1, wherein the organic semiconductor layer is formed by an evaporation method.

* * * * *